US012808966B2

(12) United States Patent
Ulrich et al.

(10) Patent No.: US 12,808,966 B2
(45) Date of Patent: Nov. 24, 2026

(54) METHOD OF ESTIMATING MOTION OF AN OBJECT AND/OR MAGNETIC FIELD OFFSETS DURING AN MRI SCAN

(71) Applicants: EIDGENOESSISCHE TECHNISCHE HOCHSCHULE (ETH), Zurich (CH); UNIVERSITAET ZUERICH, Zurich (CH)

(72) Inventors: Thomas Ulrich, Zurich (CH); Klaas Pruessmann, Zurich (CH)

(73) Assignees: EIDGENOESSISCHE TECHNISCHE HOCHSCHULE (ETH), Zurich (CH); UNIVERSITAET ZUERICH, Zurich (CH)

( * ) Notice: Subject to any disclaimer, the term of this patent is extended or adjusted under 35 U.S.C. 154(b) by 0 days.

(21) Appl. No.: 18/557,980

(22) PCT Filed: Apr. 30, 2022

(86) PCT No.: PCT/EP2022/061641
§ 371 (c)(1),
(2) Date: Oct. 30, 2023

(87) PCT Pub. No.: WO2022/229465
PCT Pub. Date: Nov. 3, 2022

(65) Prior Publication Data

US 2024/0201303 A1 Jun. 20, 2024

(30) Foreign Application Priority Data

| | | |
|---|---|---|
| Apr. 30, 2021 | (EP) | 21171727 |
| Nov. 30, 2021 | (EP) | 21211414 |
| Mar. 29, 2022 | (EP) | 22165204 |

(51) Int. Cl.
*G01R 33/565* (2006.01)
*G01R 33/54* (2006.01)

(52) U.S. Cl.
CPC ..... *G01R 33/56563* (2013.01); *G01R 33/543* (2013.01); *G01R 33/56509* (2013.01)

(58) Field of Classification Search
CPC ............ G01R 33/56563; G01R 33/543; G01R 33/56509; G01R 33/5608; G01R 33/5676; G01R 33/4818
See application file for complete search history.

(56) References Cited

U.S. PATENT DOCUMENTS

| | | | |
|---|---|---|---|
| 6,771,068 B2 | 8/2004 | Dale et al. | |
| 7,358,732 B2 | 4/2008 | Van Der Kouwe et al. | |
| 2019/0035119 A1 * | 1/2019 | Cauley | G06T 7/13 |

OTHER PUBLICATIONS

Ulrich, Thomas, and Klaas Paul Pruessmann. "Detection of Head Motion using Navigators and a Linear Perturbation Model." ISMRM & SMRT Virtual Conference & Exhibition. May 2021. (Year: 2021).*

(Continued)

*Primary Examiner* — Rishi R Patel
(74) *Attorney, Agent, or Firm* — Agris & von Natzmer LLP; Joyce von Natzmer

(57) ABSTRACT

In a method of estimating motion of an object and/or magnetic field offsets in a region surrounding the object during a magnetic resonance (MR) imaging scan of the object, superimposed magnetic fields and radiofrequency fields are generated according to an MR sequence for forming images, the MR sequence comprising a train of sequence modules, each sequence module comprising a radiofrequency (RF) excitation segment and an image encoding gradient segment, the MR sequence further comprising a plural-ity of navigator gradient segments. The navigator signal is acquired along a trajectory in k-space and expressed as a discrete time series comprising a predefined number of complex-valued signal datapoints. The navigator signal acquired in a first sequence module is used to calcu- (Continued)

late a transformation matrix which relates rotation angles and translational shifts and/or changes of the magnetic field to corresponding changes in navigator signal in a first order approximation. The navigator signal acquired in a subsequent sequence module is used to estimate object motion in terms of a translational dis-placement and a rotational displacement of the object and/or magnetic field offsets in terms of a scalar field variation and a vectorial field variation between the first sequence module and the subsequent sequence module by solving a corresponding linear least-squares estimation problem.

20 Claims, 10 Drawing Sheets

(56) References Cited

OTHER PUBLICATIONS

Van Der Kouwe Andre J.W. et al, "Real-time rigid body motion correction and shimming using cloverleaf navigators", Magnetic Resonance in Medicine, vol. 56, No. 5, p. 1019-1032 (Oct. 6, 2006).
Vionnet Laetitia et al, "Simultaneous feedback control for joint field and motion correction in brain MRI", NeuroImage, vol. 226, 117286 (Sep. 28, 2020).
Alhamud A et al, "Real-time measurement and correction of both B0 changes and subject motion in diffusion tensor imaging using a double volumetric navigated (DvNav) sequence", Neuroimage, Elsevier, Amsterdam, NL, vol. 126, p. 60-71 (Nov. 14, 2015).
Godenschweger F. et al., "Motion correction in MRI of the brain", Phys. Med. Biol. 61, R32 (2016).
Keating Brian et al, "Real-time dynamic frequency and shim correction for single-voxel magnetic resonance spectroscopy", Magnetic Resonance in Medicine, vol. 68, No. 5, p. 1339-1345 (Jan. 3, 2012).
MacLaren et al., "Prospective motion correction in brain imaging: A review", Magnetic Resonance in Medicine 69, p. 621-636 (2013).
Thomas Ulrich and Klaas Paul Pruessman, "Detection of Head Motion using Navigators and a Linear Perturbation Model", Proceedings of The 2021 ISMRM & SMRT Annual Meeting & Exhibition, May 15-20, 2021, ISMRM, 2030 Addison Street, 7th Floor, Berkeley, CA 94704 USA, No. 1389 (Apr. 30, 2021).
Ulrich, T. Patzig, F. Wilm, B. J. Pruessmann, K. P, "Towards Optimal Design of Orbital K-Space Navigators for 3D Rigid-Body Motion Estimation", Poster, ISMRM & SMRT Virtual Conference & Exhibition (Jul. 24, 2020).
Versluis M J et al, "Origin and reduction of motion and f0 artifacts in high resolution T"2*-weighted magnetic resonance imaging: Application in Alzheimer's disease patients", vol. 51, No. 3, p. 1082-1088 (Jul. 1, 2010).
Wallace Tess E. et al, "Rapid measurement and correction of spatiotemporal B 0 field changes using FID navigators and a multi-channel reference image", Nuclear Magnetic Resonance in medicine, vol. 83, No. 2, p. 575-589 (Feb. 1, 2020).
Zaitsev M. et al., "Motion artifacts in MRI: A complex problem with many partial solutions", Journal of Magnetic Resonance Imaging 42, 887-901 (2015).

* cited by examiner

METHOD OF ESTIMATING MOTION OF AN OBJECT AND/OR MAGNETIC FIELD OFFSETS DURING AN MRI SCAN

CROSS-REFERENCE TO RELATED APPLICATIONS

This is the U.S. national stage of international application no. PCT/EP2022/061641, filed Apr. 30, 2022 designating the United States and claiming priority to European application nos. EP 21171727.7, filed Apr. 30, 2021, EP 21211414.4, filed Nov. 30, 2021 and EP 22165204.3, filed Mar. 29, 2022, which are incorporated herein by reference in their entireties.

FIELD OF THE INVENTION

The present invention generally relates to a method of estimating motion of an object and/or magnetic field offsets during a magnetic resonance (MR) imaging scan of the object.

BACKGROUND OF THE INVENTION

Patient motion is one of the leading causes of image artifacts in MR imaging. Many different methods for motion correction have been developed during the last few decades [1-3]. K-space navigators are a particularly promising approach, because they are a purely MR-signal-based approach that does not require any additional hardware.

Methods of navigator-based motion estimation have been described, among others, in U.S. Pat. Nos. 6,771,068 B2 and 7,358,732, B2.

SUMMARY OF THE INVENTION

It is the principal object of the present invention to overcome the limitations and disadvantages of currently known methods.

According to one aspect of the invention, there is provided a method of estimating motion of an object during a magnetic resonance (MR) imaging scan of the object, wherein a main magnetic field is generated in the object of interest by a main magnet and wherein superimposed magnetic fields and radiofrequency fields are generated according to an MR sequence for forming images,

- the MR sequence comprising a train of sequence modules, each sequence module comprising a radiofrequency (RF) excitation segment and an image encoding gradient segment,
- said MR sequence further comprising a plurality of navigator gradient segments, in which method

- object signal is acquired with an RF receive coil or coil array during a measurement segment of each sequence module,
- navigator signal is acquired with said RF receive coil during each one of said navigator gradient segments.

The term "object of interest" shall be understood to include any objects amenable to magnetic resonance imaging. In particular, this term shall also include any human or animal subject, including human patients in need of diagnostic and/or therapeutic intervention.

According to this aspect

- said navigator signal is acquired along a trajectory k(t) in k-space

- said navigator signal in a given sequence module is expressed as a discrete time series comprising a predefined number N of complex-valued signal data points $$s(k(t_i)),\ \text{wherein}\ i = 1\ \text{to}\ N,$$

- the navigator signal $s(k(t_i))$ acquired in a first sequence module is used to calculate a transformation matrix M which relates rotation angles and translational shifts to corresponding changes in navigator signal in a first-order approximation,
- the navigator signal $\tilde{s}(k(t_i))$ acquired in a subsequent sequence module is used to estimate object motion in terms of a translational displacement Δx and a rotational displacement θ of the object between said first sequence module and said subsequent sequence module by solving the following linear least-squares estimation problem:

$$\min_{\Delta x_1,\Delta x_2,\Delta x_3,\theta_1,\theta_2,\theta_3} \left\| (\tilde{s} - s) - M \begin{pmatrix} \Delta x_1 \\ \Delta x_2 \\ \Delta x_3 \\ \theta_1 \\ \theta_2 \\ \theta_3 \end{pmatrix} \right\|_2^2$$

For brevity, said navigator signal $\tilde{s}(k(t_i))$ acquired in a subsequent sequence module will also be denoted as "subsequent navigator signal $\tilde{s}(k(t_i))$". Moreover, for the sake of clarity and simpler notation, the method will first be explained without regard to multichannel RF receive arrays. It will be explained afterwards how to process navigator signals acquired using a multichannel array.

Advantageous embodiments are defined hereinbelow and in the dependent claims.

The invention relies on the principle that rotations of an imaged object rotate the k-space signal accordingly, while translations lead to a linear phase shift on the signal. These are well-known properties of the Fourier transform. Formally, if one denotes by s(k(t)) and $\tilde{s}(k(t))$ the k-space signal before and after applying a 3×3 rotation matrix R(θ) and a 3D shift by the vector Δx, then:

$$\tilde{s}(k(t)) = s(R(\theta)k(t))e^{i\Delta x^T R(\theta)k(t)}$$

Here, $\theta=(\theta_1, \theta_2, \theta_3)^T$ denotes a column vector of three rotation angles, each one around one coordinate axis. Similarly, $\Delta x=(\Delta x_1, \Delta x_2, \Delta x_3)^T$ is a three-element column vector, which describes the translational displacements along the three coordinate axes. If the rotation angles and translation vector are small, then the above equation can be approximated by a first-order Taylor expansion, which can be written as a linear function of the angles and shift. To this end, one needs to interpret s as a function of rotation angles θ and shifts Δx.

The assumption of small rotation angles and shifts is satisfied if the imaged object only performs small motions during the imaging scan. If the object performs larger motion, the assumption is usually still satisfied if the estimated motion parameters are fed back to the MR scanner system immediately, and the scanner compensates for object motion in real-time, as explained in U.S. Pat. No. 6,771,068

B2. In particular, the orientation of the scanner gradient coordinate system must follow rotations of the imaged object. Furthermore, to compensate for translation of the object, a phase offset must be added onto the navigator and imaging signal.

Calculating the derivatives of the above equation with respect to the shifts $\Delta x_1$, $\Delta x_2$, $\Delta x_3$ is straightforward since the complex exponential function has the following well-known power series expansion:

$$e^{ix} = \sum_{n=0}^{\infty} \frac{(ix)^n}{n!} = 1 + ix + O(n^2)$$

Finding the derivatives (or an approximation thereof) of the expression with respect to the rotation angles $\theta_1$, $\theta_2$, $\theta_3$ is more challenging and will be explained hereinbelow. If one denotes these derivatives by $$\frac{ds}{d\theta_d}\theta_d$$

(for d=1, 2, 3), then the Taylor expansion is as follows:

$$\tilde{s}(k(t)) - s(k(t)) = \sum_{d=1}^{3} \frac{ds}{d\theta_d}\theta_d + i\Delta x^T k(t) s(k(t))$$

In theory, the derivatives $$\frac{ds}{d\theta_d}$$

can be calculated using the chain rule of differentiation:

$$\frac{ds}{d\theta_d} = \frac{\partial s}{\partial k} \cdot \frac{\partial}{\partial \theta_d}[R(\theta)k(t)]$$

In practice, however, the partial derivative $$\frac{\partial s}{\partial k}$$

is unknown. Instead, if one interprets the signal s(k(t)) as a function of time, the time-derivative $\dot{s}(t)$ can be calculated. It is equivalent to the directional derivative of s(k(t)) in the direction of $\dot{k}(t)$, which is the tangential vector of the navigator k-space trajectory.

$$\dot{s}(t) = \frac{\partial s}{\partial k} \cdot \dot{k}(t)$$

From linear algebra it is known that, given two vectors v and w, the vector v can be written as the sum of two vectors such that the first vector is parallel to w and the second vector is orthogonal to w. The first of these two vectors is also called the orthogonal projection of v onto w. In this way, the rotational displacement $$\frac{\partial}{\partial \theta_d}[R(\theta)k(t)]$$

can be split into a tangential component of the k-space trajectory (a multiple of $\dot{k}(t)$), and a component which is orthogonal to $\dot{k}(t)$.

$$\frac{\partial}{\partial \theta_d}[R(\theta)k(t)] = \frac{\dot{k}(t)}{\|\dot{k}(t)\|^2}\left(\dot{k}(t)\right)^T \frac{\partial}{\partial \theta_d}[R(\theta)k(t)] + \ldots \text{ (orthogonal component)}$$

By combining the last three equations, one can see that the derivative $$\frac{\partial s}{\partial \theta_d}$$

can be split into a tangential and an orthogonal part.

$$\frac{ds}{a\theta_d} = \frac{\partial s}{\partial k} \cdot \frac{\partial}{\partial \theta_d}[R(\theta)k(t)] = \frac{\dot{s}(t)}{\|\dot{k}(t)\|^2}\left(\dot{k}(t)\right)^T \frac{\partial}{\partial \theta_d}[R(\theta)k(t)] + \ldots \text{ (orthogonal component)}$$

Calculating the derivative in any direction orthogonal to $\dot{k}(t)$, would require k-space data from the neighborhood of the navigator trajectory, which is not sampled. One practical solution to this problem is to consider only the tangential component of the derivative $$\frac{ds}{d\theta_d},$$

denoted here as $\eta_d$:

$$\eta_d(t) = \frac{\dot{s}(t)}{\|\dot{k}(t)\|^2}\left(\dot{k}(t)\right)^T \frac{\partial}{\partial \theta_d}[R(\theta)k(t)]$$

Alternatively, the full derivatives $$\frac{ds}{d\theta_d}$$

can be determined by reference measurement of finite differences under small rotations. For a sufficiently small angle $\alpha$, one can then determine the derivatives as $$\frac{ds}{d\theta_d} \approx \frac{1}{\alpha}[s(R(\alpha \cdot e_d)k(t)) - s(k(t))]$$

Here, $e_d$ denotes the d-th standard unit vector. Navigator signals $s(R(\alpha \cdot e_d)\ k(t))$ are acquired for a small rotation around each of the three coordinate axes. In other words, the transformation matrix M is calculated from a set of initial navigator signals, namely the navigator signal $s(k(t_i))$ acquired in said first sequence module and the navigator signals $s_j(k(t_i))$ acquired in one or further sequence modules, which are all executed before said subsequent navigator signal $\tilde{s}(k(t_i))$ used to estimate object motion.

Since the measurement noise on the complex-valued navigator signals follows a zero-mean Gaussian distribution, one calculates the angles θ and shift vector Δx by linear least-squares estimation. The spectrometer samples the MR signal only at discrete timepoints $t_1, t_2, \ldots, t_n$. It is advantageous to write the estimation problem in matrix-vector form. One defines the following matrix M, which relates rotation angles and shifts to signal perturbations. Each row of M corresponds to one time point $t_i$ at which the spectrometer has acquired the signal value $s(k(t_i))$. The first three columns of M represent the derivatives of the signal with respect to the shifts $\Delta x_1$, $\Delta x_2$, and $\Delta x_3$, respectively. The last three columns represent the derivatives (or approximations thereof) with respect to the rotation angles $\theta_1$, $\theta_2$, $\theta_3$.

$$M = \begin{pmatrix} ik_1(t_1)s(k(t_1)) & ik_2(t_1)s(k(t_1)) & ik_3(t_1)s(k(t_1)) & \eta_1(t_1) & \eta_2(t_1) & \eta_3(t_1) \\ ik_1(t_2)s(k(t_2)) & ik_2(t_2)s(k(t_2)) & ik_3(t_2)s(k(t_2)) & \eta_1(t_2) & \eta_2(t_2) & \eta_3(t_2) \\ \vdots & \vdots & \vdots & \vdots & \vdots & \vdots \\ ik_1(t_n)s(k(t_n)) & ik_2(t_n)s(k(t_n)) & ik_3(t_n)s(k(t_n)) & \eta_1(t_n) & \eta_2(t_n) & \eta_3(t_n) \end{pmatrix}$$

If one stacks the sampled MR signal into column vectors s, $\tilde{s}$, one needs to solve the following linear least-squares estimation problem:

$$\min_{\Delta x_1, \Delta x_2, \Delta x_3, \theta_1, \theta_2, \theta_3} \left\| (\tilde{s} - s) - M \begin{pmatrix} \Delta x_1 \\ \Delta x_2 \\ \Delta x_3 \\ \theta_1 \\ \theta_2 \\ \theta_3 \end{pmatrix} \right\|_2^2$$

According to an advantageous embodiment (claim 2), this is done by multiplication of the signal vectors and the Moore-Penrose pseudoinverse of M:

$$\begin{pmatrix} \Delta x_1 \\ \Delta x_2 \\ \Delta x_3 \\ \theta_1 \\ \theta_2 \\ \theta_3 \end{pmatrix} = M^+(\tilde{s} - s)$$

Given the usual acquisition bandwidths in magnetic resonance imaging and the expected readout time of the navigator signals, the number of rows of the matrix M will be significantly larger than the number of columns. Thus, the estimation problem is highly overdetermined.

It will be obvious to a person skilled in the art that, apart from applying the Moore-Penrose pseudoinverse, there exist many different well-established methods to calculate the solution of the above least-squares estimation problem. These include, among others, the QR decomposition or the singular-value decomposition (SVD). Moreover, instead of calculating the exact solution, one could approximate it using methods like the conjugate gradients (CG) algorithm. One might also choose to apply some form of regularization to the matrix M to improve the conditioning of the estimation problem. The most common choice would be Tikhonov regularization, but many other variants are possible.

If the navigator signal is acquired using an RF coil array with several separate receive channels, one can calculate the matrix M separately for the navigator signal from each receive channel. If $s_c$, $\tilde{s}_c$ denote the signals that were acquired from channel c, and $M_c$ denotes the matrix calculated only from signals from channel c, one can calculate θ and Δx by introducing a sum over the receive channels into the linear least-squares problem:

$$\min_{\Delta x_1, \Delta x_2, \Delta x_3, \theta_1, \theta_2, \theta_3} \sum_{c=1}^{C} \left\| (\tilde{s}_c - s_c) - M_c \begin{pmatrix} \Delta x_1 \\ \Delta x_2 \\ \Delta x_3 \\ \theta_1 \\ \theta_2 \\ \theta_3 \end{pmatrix} \right\|_2^2$$

Alternatively, one can combine the signal values from the separate receive channels into one virtual receive channel by means of a weighted sum. This process is known in MRI literature as coil compression or array compression. The matrix M and, ultimately, the values of θ and Δx would then be calculated from the combined navigator signal.

In simple terms, the invention relies on a novel algorithm for navigator-based motion estimation that uses a linearized perturbation model of complex-valued signal changes for estimating rotations and translations with high accuracy and low computational complexity.

The timing of the navigator gradient segments may be selected in accordance with other requirements of the MRI scan. It will be understood that the temporal separation between subsequent navigator gradient segments shall be small enough to allow neglection of higher order terms in the applied formalism.

According to an advantageous embodiment (claim 3), one navigator gradient segment is executed in each one of the sequence modules. In other embodiments, a navigator gradient segment is applied e.g. every second or every third sequence module. In principle one could also apply a series of non-equidistant navigator gradient segments.

As will also be understood, the navigator gradient segments shall be applied in appropriate regions of the MR sequence, i.e. in regions which do not overlap with the RF excitation segment or the image encoding segment. According to an advantageous embodiment (claim 4), each navigator gradient segment of a respective sequence module is executed between the RF excitation segment and the image encoding segment of said respective sequence module. According to another advantageous embodiment (claim 5), each navigator gradient segment of a respective sequence module is executed after the image encoding segment of said respective sequence module but before the RF excitation segment of a sequence module following said respective sequence module.

According to a further aspect of the invention (claim 6), there is provided a method of estimating magnetic field offsets in a region surrounding an object during a magnetic resonance (MR) imaging scan of the object.

Using the same principle of Taylor expansion and linear least-squares estimation, one can also estimate magnetic field offsets. The MR signal of an object, which is placed in the scanner bore, and whose transverse magnetization is described by a function ρ(x) of the 3-dimensional spatial coordinates x, is given by the formula $$s(k(t)) = \int \rho(x) e^{-ix^T k(t)} dx$$

In case of unwanted offsets ΔB(x, t) in the magnetic field, the equation changes to $$\tilde{s}(k(t)) = \int \rho(x) e^{-ix^T k(t)} e^{-i\gamma \int_0^t \Delta B(x,\tau)\, d\tau} dx$$

In order to estimate the field offset ΔB(x, t), one must first parametrize it so that it can be expressed with a finite number of parameters. Therefore, one chooses a set of basis functions that are deemed suitable to express the field offsets. One natural choice for the parametrization with respect to the spatial coordinate x is a subset of the spherical harmonics (e.g. up to $2^{nd}$ or $3^{rd}$ order) among a large range of common magnetic field expansions. For the temporal coordinate t, one could choose e.g. a polynomial basis.

The zeroth-order spherical harmonic function describes a spatially uniform magnetic field offset. In particular, if the offsets are constant with respect to the location x and the acquisition time t (during one navigator acquisition), then one can write $$\int_0^T \Delta B(x, \tau) d\tau = \Delta B_0 \cdot t.$$

The effect of such a background field offset during encoding is equivalent to multiplying the unperturbed signal with a phase offset, which is linear in time.

$$\tilde{s}(k(t)) = s(k(t)) e^{-i\gamma \Delta B_0 \cdot t} \approx s(k(t))(1 - i\gamma \Delta B_0 \cdot t)$$

The first-order spherical harmonics describe linearly increasing magnetic fields in one of the three coordinate directions (so-called gradient fields). Gradient fields are linear in the location x and therefore take the form $\Delta B(x, t) = G_1 x_1 + G_2 x_2 + G_3 x_3$ (assuming that they are constant in time), where the coefficients $G_d$ are scalars which denote the gradient strength in the three coordinate directions.

$$\tilde{s}(k(t)) = \int \rho(x) e^{-i\gamma \sum_{d=1}^{3} x_d (k_d(t) + G_d \cdot t)} dx$$

The effect of these background field gradients is equivalent to acquiring the signal at a modified k-space trajectory $\tilde{k}(t)$.

$$\tilde{s}(k(t)) = s(\tilde{k}(t)) = s\left(k(t) + \gamma \begin{pmatrix} G_1 & G_2 & G_3 \end{pmatrix}^T \cdot t\right)$$

As in the case of rotation estimation, displacement factors $\lambda_d(t)$ can be calculated.

$$\lambda_d(t) = \gamma t \frac{\dot{s}(t)}{\|\dot{k}(t)\|^2} \dot{k}_d(t)$$

As for rotation and translation estimation, one constructs a matrix Q, which relates the field offset parameters to the resulting signal changes.

$$Q = \begin{pmatrix} -i\gamma t_1 s(k(t_1)) & \lambda_1(t_1) & \lambda_2(t_1) & \lambda_3(t_1) \\ -i\gamma t_2 s(k(t_2)) & \lambda_1(t_2) & \lambda_2(t_2) & \lambda_3(t_2) \\ \vdots & \vdots & \vdots & \vdots \\ -i\gamma t_3 s(k(t_n)) & \lambda_1(t_n) & \lambda_2(t_n) & \lambda_3(t_n) \end{pmatrix}$$

Using this matrix, one calculates the field parameters by linear least-squares estimation:

$$\min_{\Delta B_0, G_1, G_2, G_3} \left\| (\tilde{s} - s) - Q \begin{pmatrix} \Delta B_0 \\ G_1 \\ G_2 \\ G_3 \end{pmatrix} \right\|_2^2$$

Beyond spatially uniform ($\Delta B_0$) and spatially linear ($G_1$, $G_2$, $G_3$) field offsets, the same principle can equally be used in conjunction with any other set of basis functions deemed suitable to expand expected field offsets. One natural choice is a subset of the spherical harmonics (e.g. up to $2^{nd}$ or $3^{rd}$ order) among a large range of common magnetic field expansions. The field expansion may also be chosen specifically for a given object, subject, or body part, using pre-measurement (e.g. by field mapping) or simulation to determine suitable basis functions. In each of these cases, to deploy the proposed method, the key step is to determine the derivatives of the navigator signals with respect to the coefficients of the field expansion, with those derivatives forming the columns of the model matrix Q. Depending on the basis functions, these derivatives, or approximations thereof, may be available analytically or must be determined by measurement or simulation. For measurement of the signal derivative, one option is to acquire navigator signals first in the reference state and then, again, in the presence of a small field offset of the spatial structure given by the basis function in question. A good approximation of the derivative is then given by the difference of the navigator signals divided by the strength of the perturbation in the scale of the basis function. This option is straightforward, e.g., for a basis formed from the fields patterns that can be generated with available gradient and shim coils. Available gradient and shim fields form particularly favorable bases in that they not only readily permit measurement of the respective signal derivatives but also enable active compensation of field offsets, once detected, by actuation of the same gradient and shim channels.

Additionally, besides arbitrary spatial patterns, basis functions for field expansion may also be equipped with temporal change across the duration of the navigator acquisition. One natural option is temporal change according to powers of time (1, t, $t^2$, $t^3$ . . . ), permitting the determination of Taylor series with respect to time. Another useful option is exponential decay over time ($e^{-at}$) to capture field offset caused by eddy currents. With any combination of chosen spatial and temporal variation for each basis function, the corresponding column of the Q matrix is again given by the derivative of the navigator signal with respect to the related expansion coefficient, determined analytically, by measurement, or by simulation.

According to a further aspect of the invention (claim 7), there is provided a method of estimating (i) motion of an object, and (ii) magnetic field offsets in a region surrounding the object during a magnetic resonance (MR) imaging scan of the object. The method combines the above described aspects and relies on a transformation matrix R combining the above defined matrices M and Q, i.e. a matrix with the following rows:

$$R = \begin{pmatrix} M_{11} & M_{12} & M_{13} & M_{14} & M_{15} & M_{16} & Q_{11} & Q_{12} & Q_{13} & Q_{14} \\ M_{21} & M_{22} & M_{23} & M_{24} & M_{25} & M_{26} & Q_{21} & Q_{22} & Q_{23} & Q_{24} \\ \vdots & \vdots & \vdots & \vdots & \vdots & \vdots & \vdots & \vdots & \vdots & \vdots \\ M_{N1} & M_{N2} & M_{N3} & M_{N4} & M_{N5} & M_{N6} & Q_{N1} & Q_{N2} & Q_{N3} & Q_{N4} \end{pmatrix}$$

Further aspect of the invention are defined in claims 7, 8 and 9, and explained hereinbelow.

One can use the estimated rotation angles, translational shifts, and/or field offsets, to compensate for the effects of object motion and field offsets in real-time during the scan procedure. This is generally referred to as prospective correction.

In simple terms, object motion is compensated in real-time by re-aligning the imaging volume to the rotated and shifted object. Object rotation is compensated by rotating subsequent gradient waveforms accordingly. Translation is corrected by adding a linear phase offset to the subsequent MR signals.

Since constant field offsets add a phase onto the MR signal, which is linear in acquisition time, they can be compensated by removing this phase offset from the signal values. Higher-order field offsets can be compensated using the shim coils of the MR system.

Alternatively, the effects of object motion and/or field offsets can be compensated during image reconstruction, after the scan is completed. This is generally referred to as retrospective correction.

One can also combine prospective and retrospective correction. This is useful, for example, if the real-time correction exhibits a time delay between estimating the motion and field parameters, and applying the compensation. In this case, one can use retrospective correction to correct residual errors, which could not be compensated during prospective correction because of the time delay.

For all implementations of estimation as described above (of motion parameters, field offset parameters, or both), it is favorable to use resulting estimates for active compensation during the respective MRI scan. Active compensation of motion is typically done by corresponding rotation and translation of the coordinate system in which the MRI sequence, including the navigator, is played out. This concept is known as prospective motion correction (PMC). Active compensation of field offsets is done by corresponding gradient and shim actuation as well as actuation of a $0^{th}$-order shim (uniform field) or equivalent signal demodulation. Importantly, besides eliminating error from acquired image data, such compensation also emulates the reference situation, in which the reference navigator was acquired, so that incremental motion and field offset to be detected with each individual repetition of the navigator, is small and thus consistent with first-order perturbation approach underlying the methodology.

With or without run-time compensation, perturbation of acquired raw image data by residual effective motion and/or field offsets can be addressed at the image reconstruction stage. The latter is usually most numerically benign (best-conditioned) when the underlying effective motion and field offsets are small. Therefore, correcting for detected motion and field offsets at the reconstruction level is generally most effective in combination with preceding run-time compensation.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, which show the following.

DETAILED DESCRIPTION OF THE INVENTION

Figure 1:
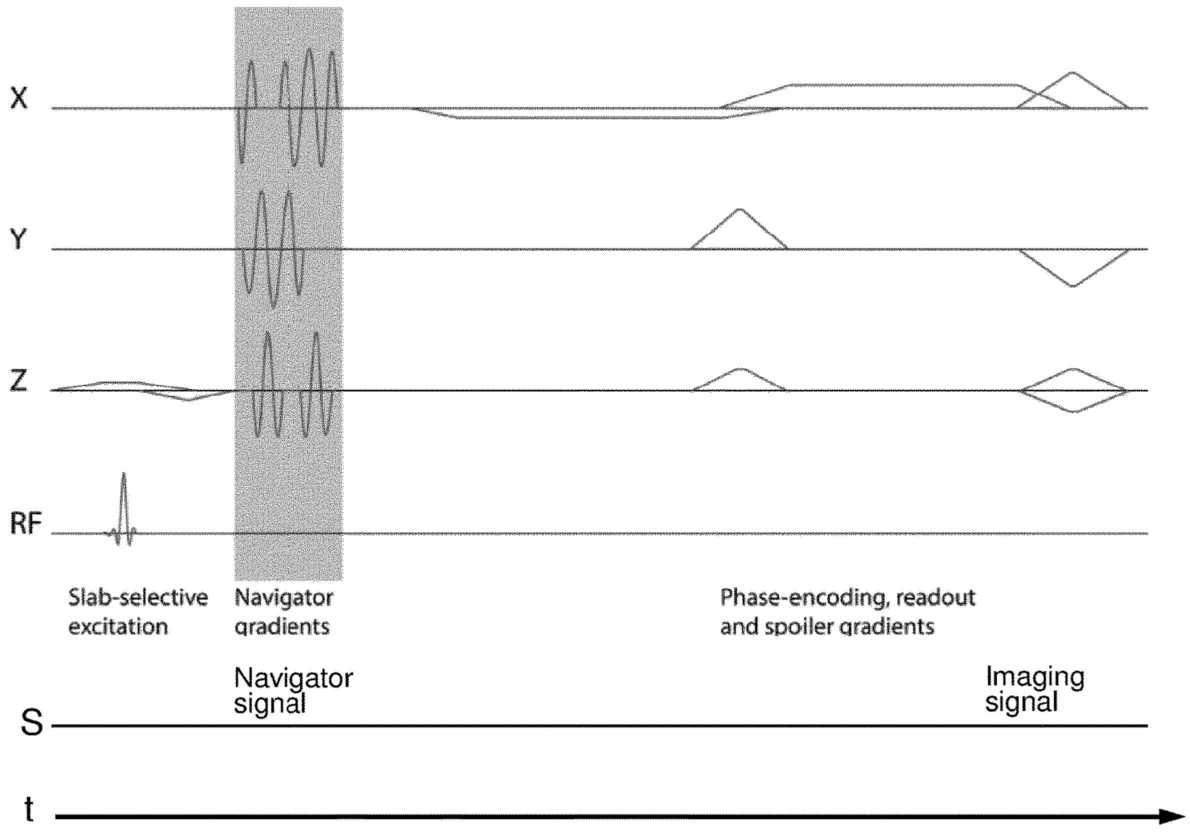
FIG. 1 a sequence diagram of a 3D T2*-weighted FFE sequence with 3D orbital navigator gradients inserted after the excitation and before the image encoding gradients.

As generally known in the field of MR, the MR sequence comprises a train of sequence modules with a sequence repetition period TR between each pair of successive sequence modules. One such sequence module is shown schematically in FIG. 1, also showing a set of navigator gradient segments, which in the example shown are located after the excitation and before the image encoding gradient segments.

EXAMPLE

Figure 2A:
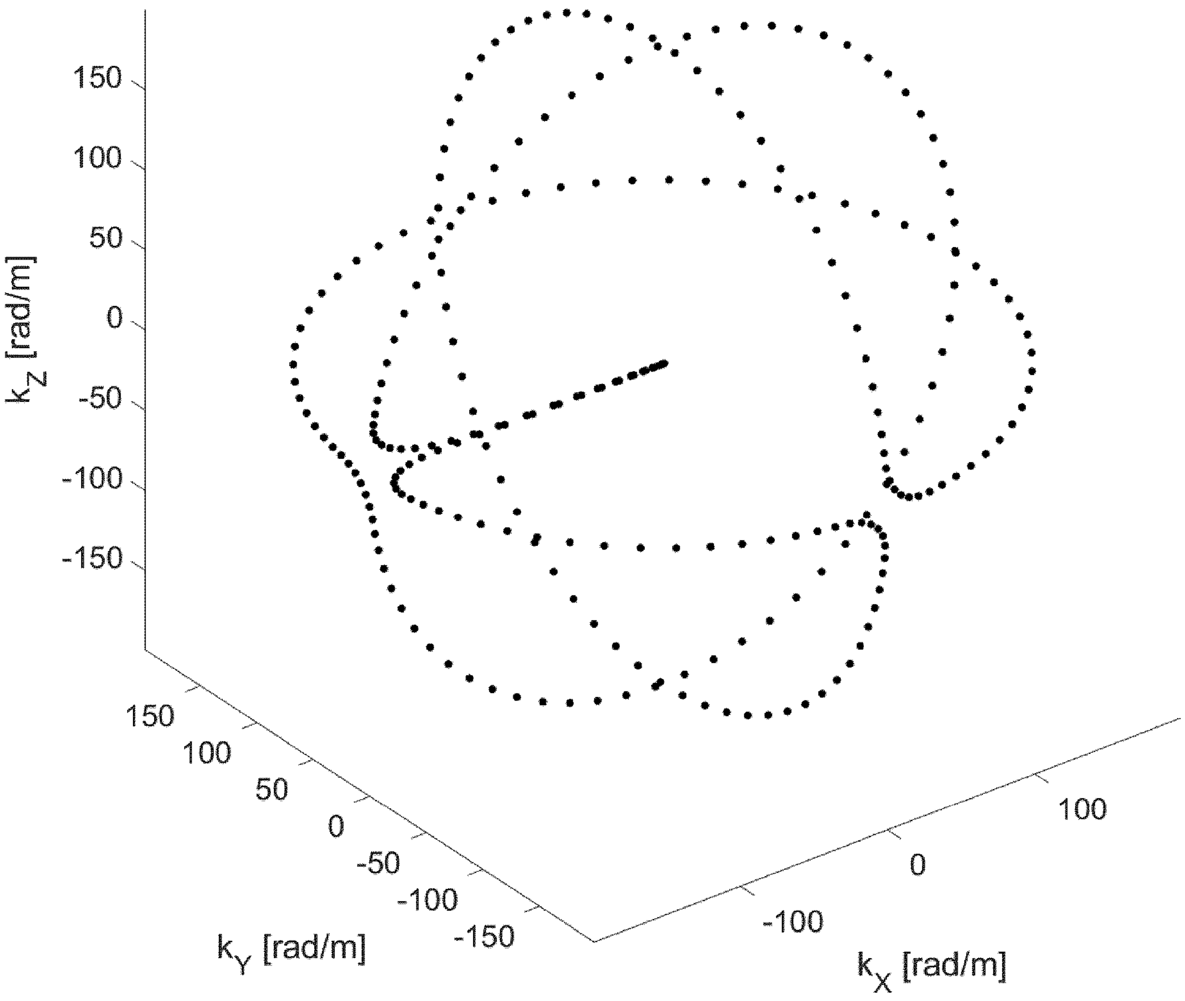
FIG. 2 an orbital navigator k-space trajectory; (a): parametric plot of the trajectory shape; (b): plots of the trajectory, gradients, and slew rate over time; the trajectory is made up of three orthogonal circles, with smooth transitions in between them; at a radius of 200 rad/m, the navigator gradients can be executed in about 1.65 milliseconds.
Figure 2B:
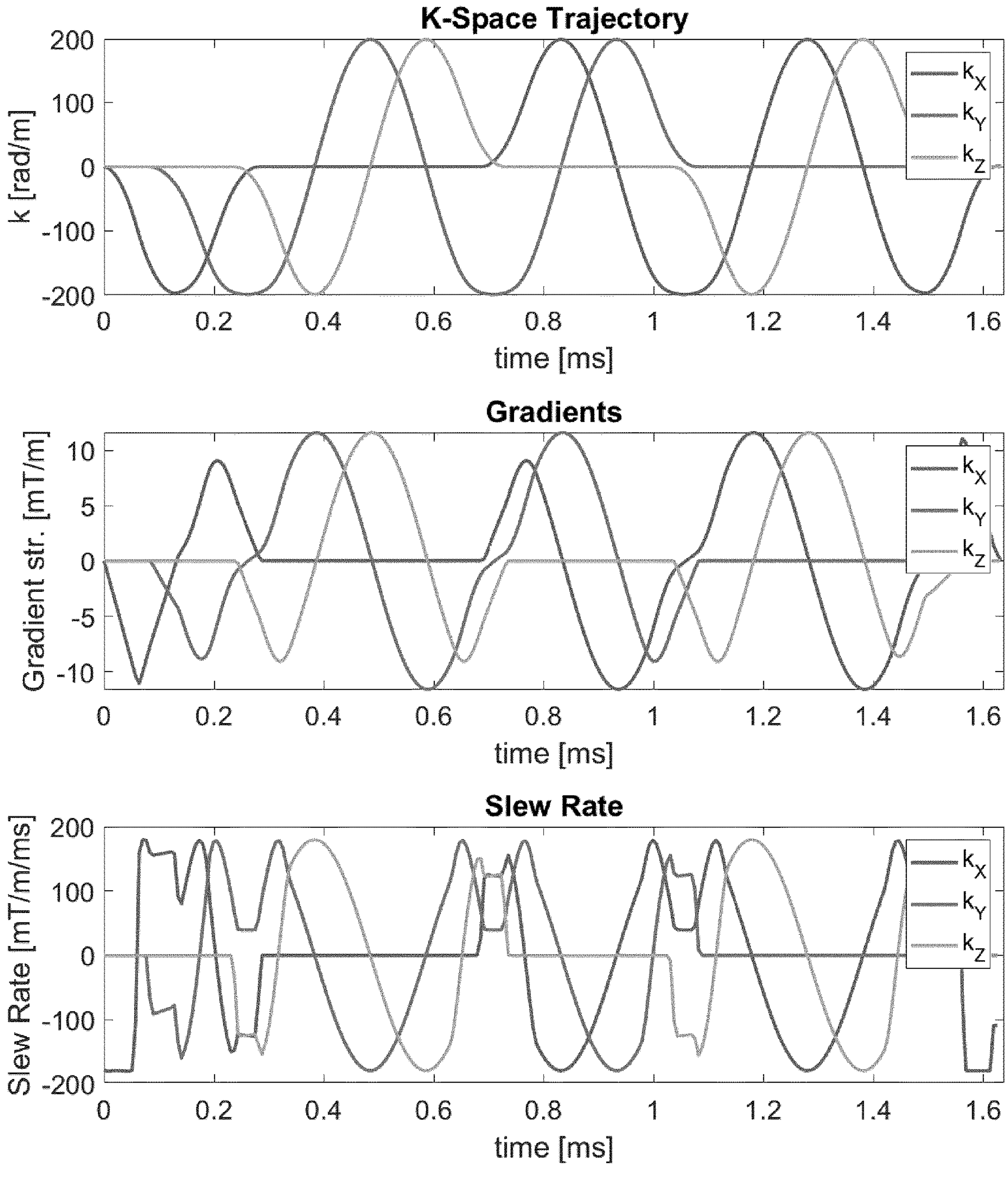

Experiments were performed at a 7T Philips Achieva scanner using a 32-channel head coil. We used a single-shot 3D orbital navigator [4], which is displayed in FIG. 2.

To examine the precision of the method, a motionless phantom (pineapple) was placed in the head coil. Navigator signals were acquired during a 3D T2*w-FFE imaging scan and motion parameters were estimated from the navigator signal.

We also performed two in-vivo experiments. For the first experiment, a volunteer was instructed to hold still during a 2.5-minute FFE scan sequence. During the second experiment, the volunteer was instructed to move their head around all six degrees of freedom. Motion parameters were estimated using our proposed algorithm.

Figure 3A:
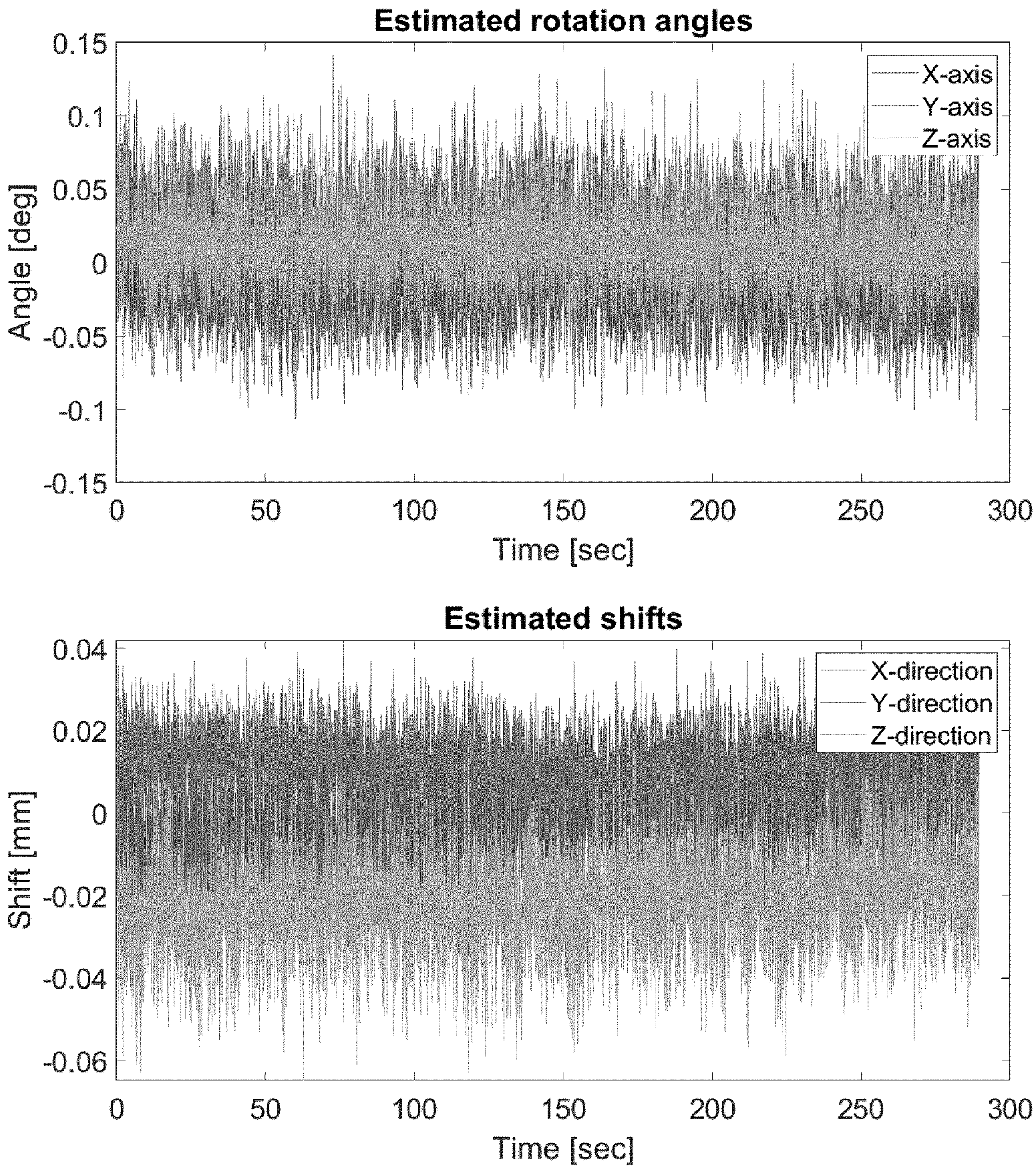
FIG. 3 (*a*): estimated rotation angles (upper panel) and translational shift (lower panel) from an experiment with a motionless phantom (pineapple); (b): standard deviation (lower panel) and root mean squares (upper panel) of the rotation angles and translation parameters over time.
Figure 3B:
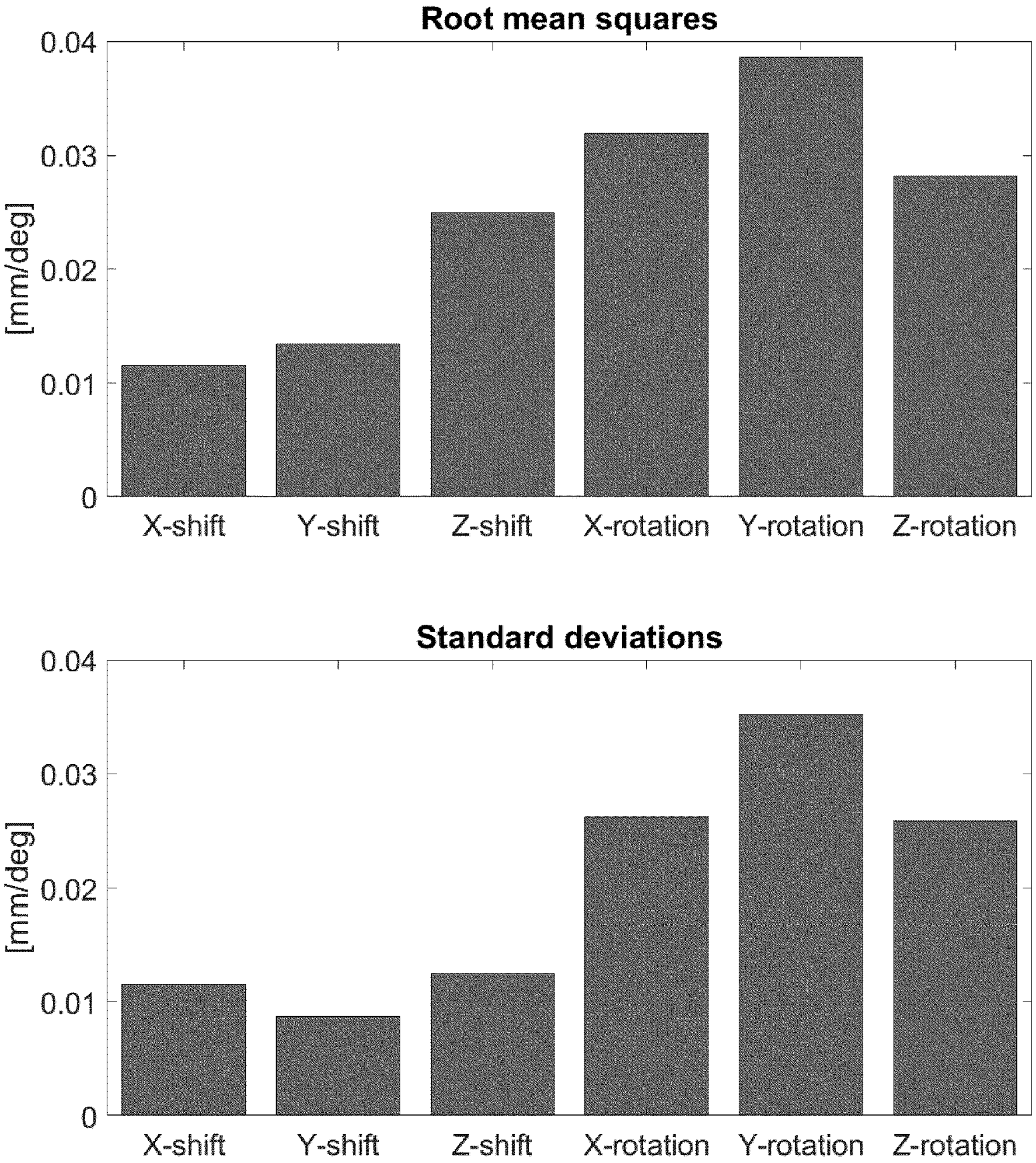

FIG. 3 shows the results from the experiment with the motionless phantom. The algorithm produced rotation angles in the range of ±0.15 degrees and shifts in the range of ±60 μm, with root-mean squares values of up to 0.04 degrees and 25 μm.

Figure 4A:
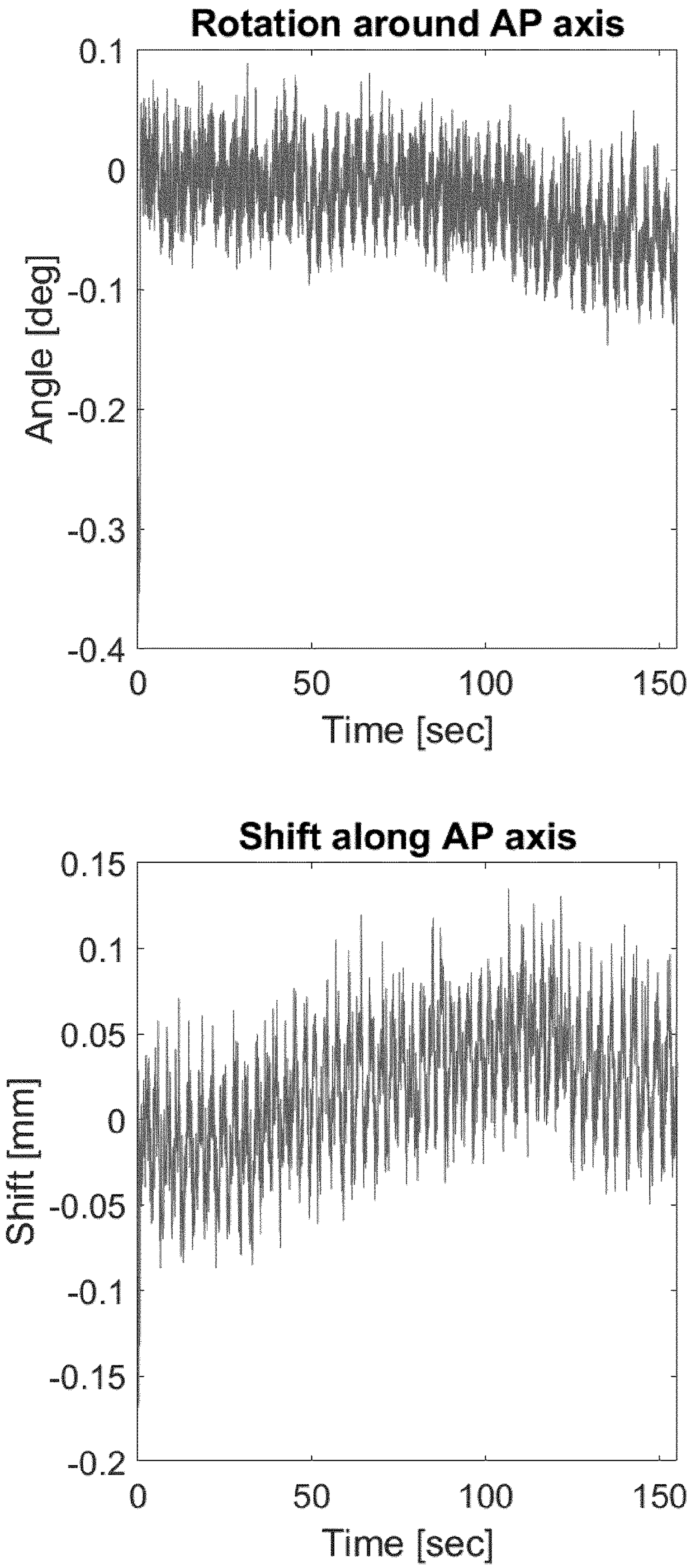
FIG. 4 (*a*) estimated motion parameters, namely, rotation around AP axis (upper panel) and shift along the anterior-posterior (AP) axis (lower panel) from an in-vivo experiment where the volunteer was instructed to hold still. (b): spectra of the motion time series of two selected axes, namely, spectrum of rotations around the left-right (LR) axis (upper panel) showing a peak in the spectrum at 1.22 Hz, and spectrum of shifts along the head-foot (HF) axis (lower panel) showing a peak at 0.30 Hz.
Figure 4B:
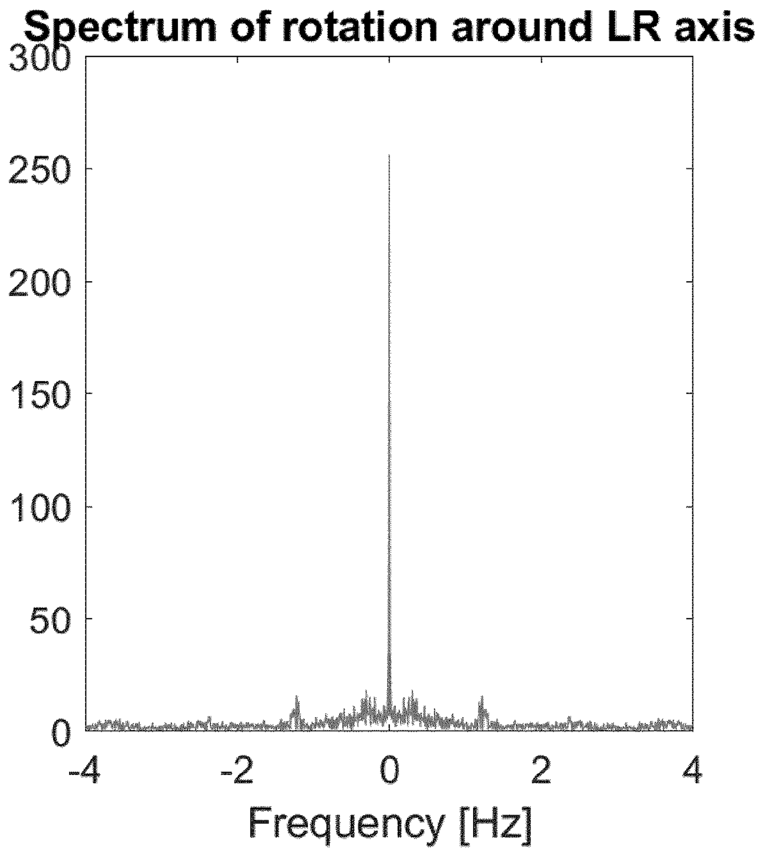
Figure 4B:
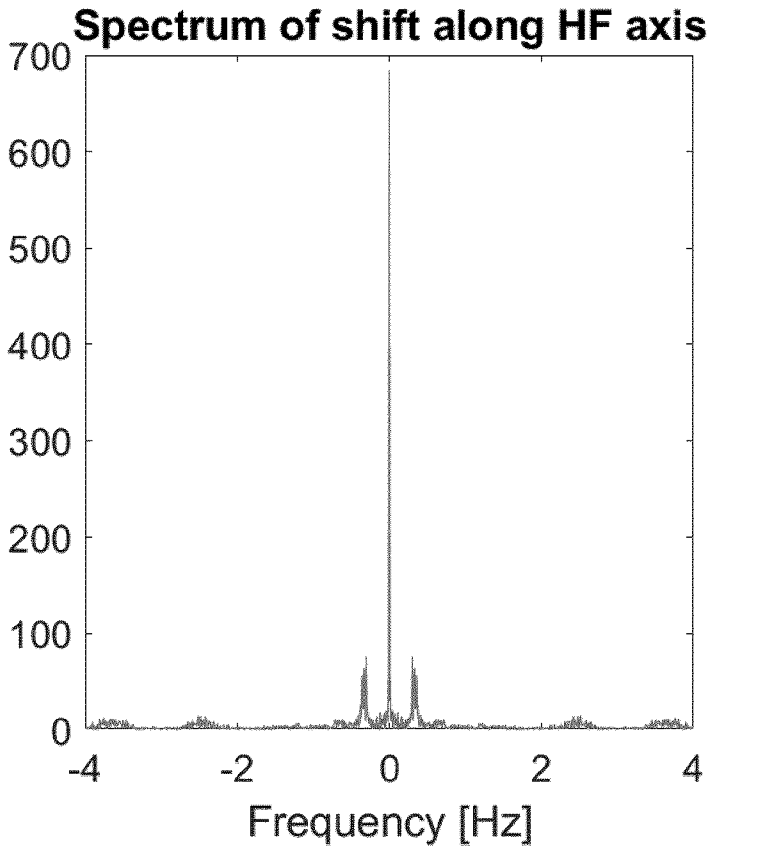
Figure 5:
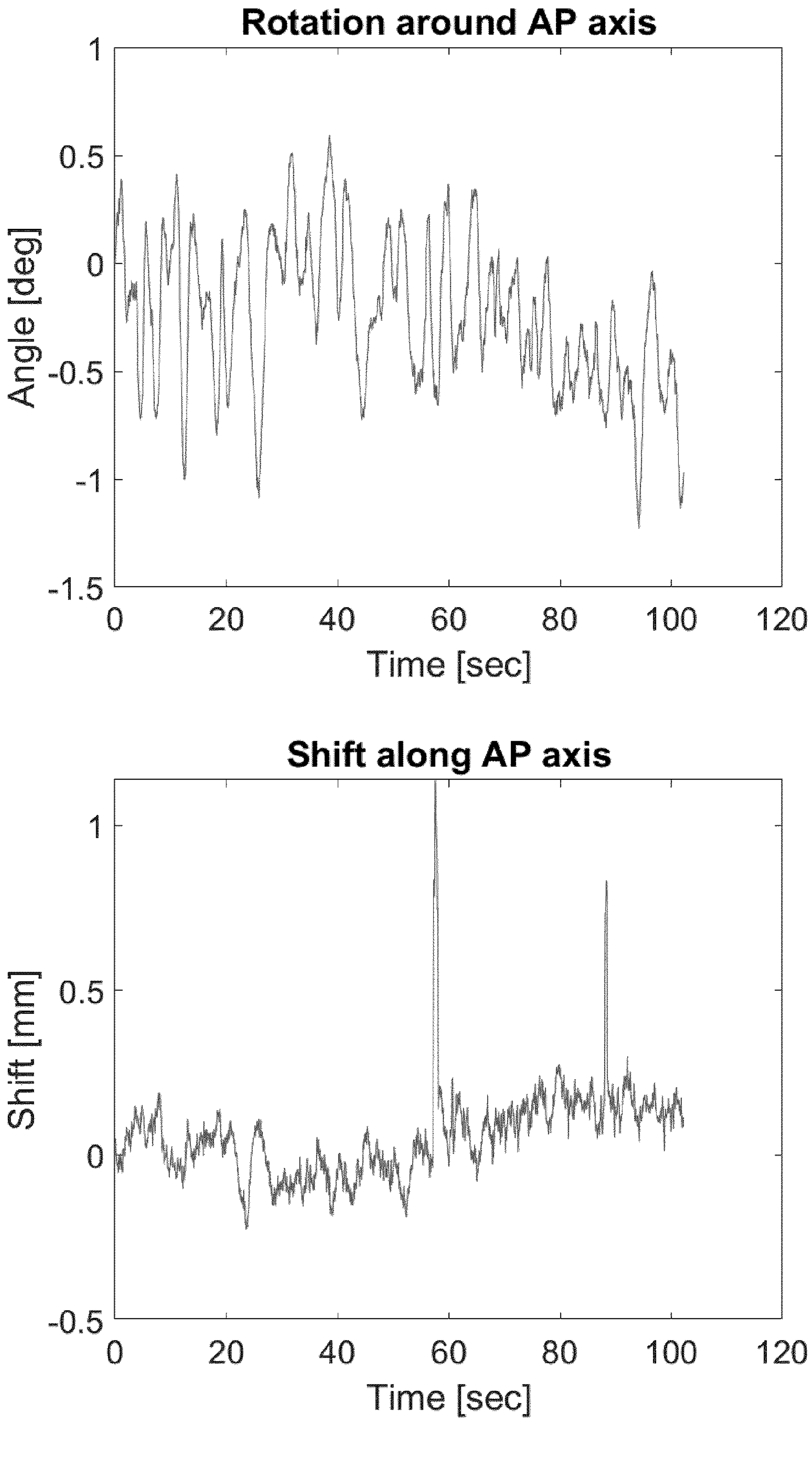
FIG. 5 estimated motion parameters in terms of rotation angle (upper panel) and shift (lower panel) from an in-vivo experiment where the volunteer was instructed to move the head around randomly around all six degrees of freedom.

FIG. 4 and FIG. 5 show the estimated rotation angles and shifts from the two in-vivo experiments. During the experiment without intentional motion, the rotation was estimated to be within the range of ±0.2 degrees and ±0.25 mm, except for the HF axis, where the estimated shift values seem to drift and oscillate around −0.2 mm. The spectrum showed distinct peaks at 0.30 Hz and 1.22 Hz.

When the volunteer moved intentionally, rotation angles of up to ±2 degrees and shifts of ±3.5 mm were reported by our algorithm.

The phantom experiment demonstrates that our method exhibits high precision and accuracy. Since we know that no actual object motion has occurred, we can conclude that our method's estimates were correct up to the RMS error of 0.04 degrees and 25 μm, and the standard deviation is of roughly the same size.

In case of the in-vivo experiment, no ground truth is available, unfortunately. However, the results indicate that our algorithm is sensitive to head motion. The peaks in the spectrum at 0.30 Hz and 1.22 Hz are likely due to respiration and heartbeat. Further investigation of the accuracy and precision for head motion estimation is to be conducted in the future.

To conclude, we have demonstrated that rigid-body motion can be accurately and precisely characterized using our motion estimation algorithm. The navigator readout is very fast and the algorithm has very low computational complexity, so the motion parameters can be calculated within milliseconds.

Figure 6:
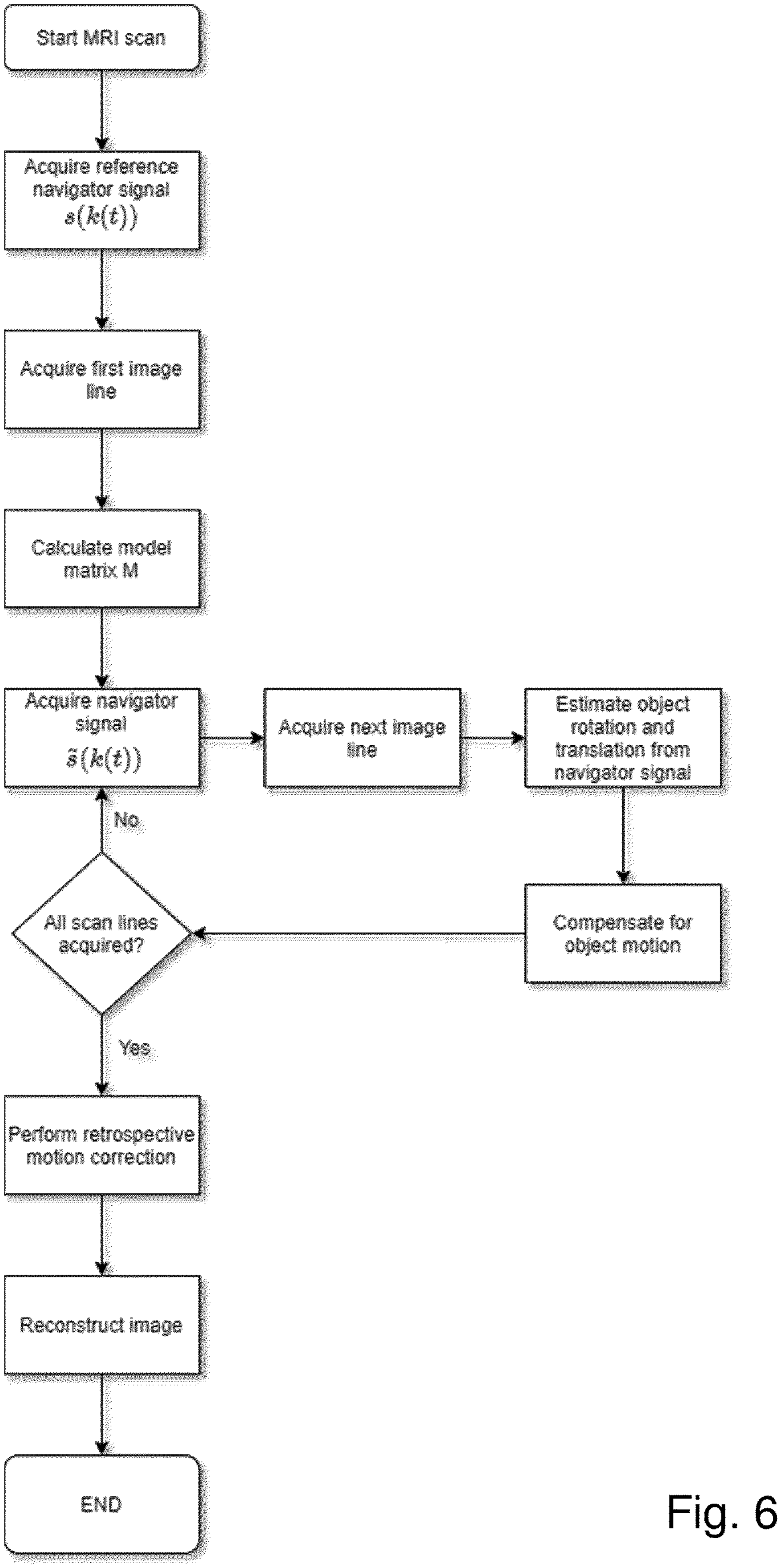
FIG. 6 a schematic representation of an embodiment of a method of estimating motion in combination with prospective and retrospective correction.

A first variant of a method of estimating motion in combination with prospective and retrospective correction is illustrated in FIG. 6.

Figure 7:
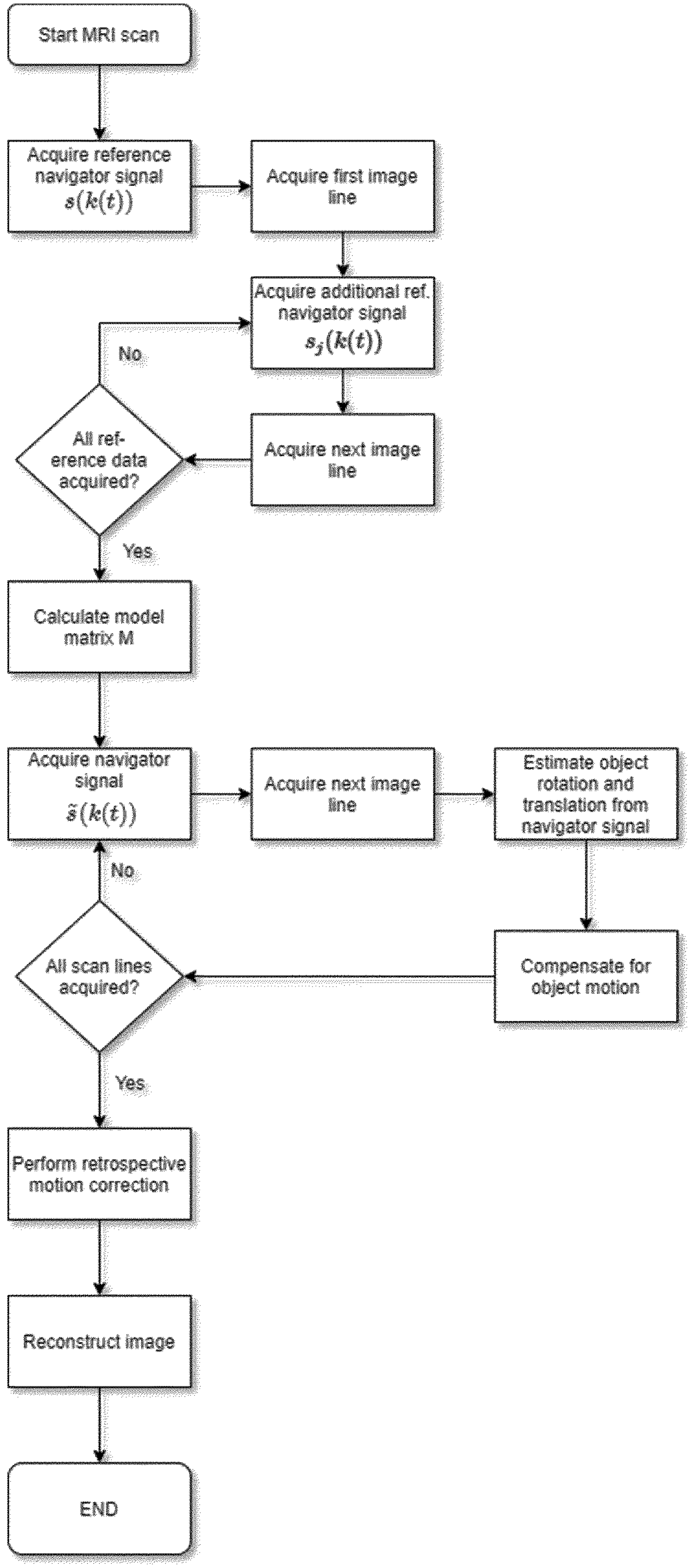
FIG. 7 a schematic representation of a second variant of a method of estimating motion in combination with prospective and retrospective correction.

A second variant of a method of estimating motion in combination with prospective and retrospective correction is illustrated in FIG. 7.

REFERENCES

[1] Zaitsev Maxim, Maclaren Julian & Herbst Michael. Motion artifacts in MRI: A complex problem with many partial solutions. Journal of Magnetic Resonance Imaging 42, 887-901 (2015).

[2] Godenschweger, F, et al. Motion correction in MRI of the brain. Phys. Med. Biol. 61, R32 (2016).

[3] Maclaren, J., Herbst, M., Speck, O. & Zaitsev, M. Prospective motion correction in brain imaging: A review. Magnetic Resonance in Medicine 69, 621-636 (2013).

[4] Ulrich, T., Patzig, F., Wilm, B. J. & Pruessmann, K. P. Towards Optimal Design of Orbital K-Space Navigators for 3D Rigid-Body Motion Estimation. ISMRM & SMRT Virtual Conference & Exhibition (2020).

The invention claimed is:

1. A method of estimating motion of an object during a magnetic resonance (MR) imaging scan of the object comprising:

generation of a main magnetic field in the object by a main magnet and generation of superimposed magnetic fields and radiofrequency fields according to an MR sequence for forming images, the MR sequence comprising a train of sequence modules, each sequence module comprising a radiofrequency (RF) excitation segment and an image encoding gradient segment, said MR sequence further comprising a plurality of navigator gradient segments, in which method an object signal is acquired with an RF receive coil or coil array during a measurement segment of each sequence module of the train of sequence modules, a navigator signal is acquired with said RF receive coil or coil array during each one of said navigator gradient segments of the plurality of navigator gradient segments, wherein said navigator signal is acquired along a trajectory k(t) in k-space, said navigator signal is expressed as a discrete time series comprising a predefined number N of complex-valued signal datapoints $$s(k(t_i)), \text{ wherein } i = 1 \text{ to } N,$$

a transformation matrix M which relates rotation angles and translational shifts to corresponding changes in the navigator signal in a first order approximation is calculated from the navigator signal $s(k(t_i))$ acquired in a first sequence module, the navigator signal $\tilde{s}(k(t_i))$ acquired in a subsequent sequence module is used to estimate object motion in terms of a translational displacement Δx and a rotational displacement θ of the object between said first sequence module and said subsequent sequence module by solving the following linear least-squares estimation problem:

$$\min_{\Delta x_1, \Delta x_2, \Delta x_3, \theta_1, \theta_2, \theta_3} \left\| (\tilde{s} - s) - M \begin{pmatrix} \Delta x_1 \\ \Delta x_2 \\ \Delta x_3 \\ \theta_1 \\ \theta_2 \\ \theta_3 \end{pmatrix} \right\|_2^2 .$$

2. The method of claim 1, wherein said linear least squares estimation problem is solved by multiplication of the navigator signal difference with Moore-Penrose pseudo-inverse matrix $M^+$ of said transformation matrix M.

3. The method of claim 1, wherein one of the navigator gradient segments is executed in each one of said sequence modules.

4. The method of claim 3, wherein the navigator gradient segment of a respective sequence module is executed between the RF excitation segment and the image encoding gradient segment of said respective sequence module.

5. The method of claim 3, wherein each of the navigator gradient segments of a respective sequence module is executed after the image encoding segment of said respective sequence module but before the RF excitation segment of a sequence module following said respective sequence module.

6. A method of estimating magnetic field offsets in a region surrounding an object during a magnetic resonance (MR) imaging scan of the object, comprising: generation of a main magnetic field in the object by a main magnet and generation of superimposed magnetic fields and radiofrequency fields according to an MR sequence for forming images, the MR sequence comprising a train of sequence modules, each sequence module comprising a radiofrequency (RF) excitation segment and an image encoding gradient segment, said MR sequence further comprising a plurality of navigator gradient segments, in which method an object signal is acquired with an RF receive coil or coil array during a measurement segment of each sequence module of the train of sequence modules, a navigator signal is acquired with said RF receive coil or coil array during each one of said navigator gradient segments of the plurality of navigator gradient segments, wherein said navigator signal is acquired along a trajectory k(t) in k-space said navigator signal is expressed as a discrete time series comprising a predefined number N of complex-valued signal datapoints $$s(k(t_i)),\ \text{wherein}\ i = 1\ \text{to}\ N,$$

a transformation matrix Q which relates changes of the main magnetic field to corresponding changes in the navigator signal in a first order approximation is calculated from the navigator signal $s(k(t_i))$ acquired in a first sequence module, the navigator signal $\tilde{s}(k(t_i))$ acquired in a subsequent sequence module is used to estimate magnetic field offsets in terms of a zeroth-order field variation $\Delta B_0$ and a first-order field variation $$\begin{pmatrix} G_1 \\ G_2 \\ G_3 \end{pmatrix}$$

between said first sequence module and said subsequent sequence module by solving the following linear least-squares estimation problem:

$$\min_{\Delta B_0, G_1, G_2, G_3} \left\| (\tilde{s} - s) - Q \begin{pmatrix} \Delta B_0 \\ G_1 \\ G_2 \\ G_3 \end{pmatrix} \right\|_2^2.$$

7. A method of estimating motion of an object and magnetic field offsets in a region surrounding the object during a magnetic resonance (MR) imaging scan of the object comprising:

generating a main magnetic field and generating superimposed magnetic fields and radiofrequency fields according to an MR sequence for forming images, the MR sequence comprising a train of sequence modules, each sequence module comprising a radiofrequency (RF) excitation segment and an image encoding gradient segment, said MR sequence further comprising a plurality of navigator gradient segments, in which method an object signal is acquired with an RF receive coil or coil array during a measurement segment of each sequence module, a navigator signal is acquired with said RF receive coil or coil array during each one of said navigator gradient segments, wherein said navigator signal is acquired along a trajectory k(t) in k-space said navigator signal, is expressed as a discrete time series comprising a predefined number N of complex-valued signal datapoints $$s(k(t_i)),\ \text{wherein}\ i = 1\ \text{to}\ N,$$

a transformation matrix R which relates rotation angles, translational shifts and changes of the main magnetic field to corresponding changes in the navigator signal in a first order approximation is calculated from the navigator signal $s(k(t_i))$ acquired in a first sequence module, the navigator signal $\tilde{s}(k(t_i))$ acquired in a subsequent sequence module is used to estimate object motion in terms of a translational displacement $\Delta x$ and a rotational displacement $\theta$ of the object and magnetic field offsets in terms of a scalar field variation $\Delta B_0$ and a vectorial field variation $$\begin{pmatrix} G_1 \\ G_2 \\ G_3 \end{pmatrix}$$

between said first sequence module and said subsequent sequence module by solving the following linear least-squares estimation problem:

$$\min_{\Delta x, \theta, \Delta B_0, G_1, G_2, G_3} \left\| (\tilde{s} - s) - R \begin{pmatrix} \Delta x_1 \\ \Delta x_2 \\ \Delta x_3 \\ \theta_1 \\ \theta_2 \\ \theta_3 \\ \Delta B_0 \\ G_1 \\ G_2 \\ G_3 \end{pmatrix} \right\|_2^2.$$

8. A method of prospectively correcting for motion of an object and/or for magnetic field offsets in a region surrounding the object during a magnetic resonance (MR) imaging scan of the object, wherein the method according to claim 1 is carried out yielding an estimate of the object's motion and/or magnetic field offsets, which estimate is used to correct a subsequent execution of the sequence module.

9. A method of retrospectively correcting for motion of an object and/or for magnetic field offsets in a region surrounding the object during a magnetic resonance (MR) imaging scan of the object, wherein the method according to claim 1 is carried out yielding an estimate of the object's motion and/or magnetic field offsets, which estimate is used to correct an MR image reconstructed from said MR image forming sequence.

10. A method of correcting for motion of an object and/or for magnetic field offsets in a region surrounding the object during a magnetic resonance (MR) imaging scan of the object, comprising prospectively and retrospectively correcting for motion of an object and/or for magnetic field offsets in a region surrounding the object during the magnetic resonance (MR) imaging scan of the object, wherein the method of claim 1 is carried out yielding an estimate of the object's motion and/or magnetic field offsets, which estimate is used to correct:

(i) a subsequent execution of the sequence module, and (ii) an MR image reconstructed from said MR image forming sequence.

11. The method of claim 1, wherein the transformation matrix M is calculated from the navigator signal $s(k(t_i))$ acquired in a first sequence module including the navigator signal $s_j(k(t_i))$ acquired in at least one further sequence module.

12. The method of claim 6, wherein the transformation matrix Q is calculated from the navigator signal $s(k(t_i))$ acquired in a first sequence module including the navigator signal $s_j(k(t_i))$ acquired in at least one further sequence module.

13. The method of claim 7, wherein the transformation matrix R is calculated from the navigator signal $s(k(t_i))$ acquired in a first sequence module including the navigator signal $s_j(k(t_i))$ acquired in at least one further sequence module.

14. The method of claim 2, wherein one of the navigator gradient segments is executed in each one of said sequence modules.

15. The method of claim 14, wherein the navigator gradient segment of a respective sequence module is executed between the RF excitation segment and the image gradient encoding segment of said respective sequence module.

16. The method of claim 14, wherein each of the navigator gradient segments of a respective sequence module is executed after the image encoding segment of said respective sequence module but before the RF excitation segment of a sequence module following said respective sequence module.

17. A method of prospectively correcting for motion of an object and/or for magnetic field offsets in a region surrounding the object during a magnetic resonance (MR) imaging scan of the object, wherein the method according to claim 7 is carried out yielding an estimate of the object's motion and/or magnetic field offsets, which estimate is used to correct a subsequent execution of the sequence module.

18. A method of retrospectively correcting for motion of an object and/or for magnetic field offsets in a region surrounding the object during a magnetic resonance (MR) imaging scan of the object, wherein the method according to claim 7 is carried out yielding an estimate of the object's motion and/or magnetic field offsets, which estimate is used to correct an MR image reconstructed from said MR image forming sequence.

19. The method of correcting for motion of an object and/or for magnetic field offsets in a region surrounding the object during a magnetic resonance (MR) imaging scan of the object, comprising prospectively and retrospectively correcting for motion of an object and/or for magnetic field offsets in a region surrounding the object during the magnetic resonance (MR) imaging scan of the object, wherein the method of claim 2 is carried out yielding an estimate of the object's motion and/or magnetic field offsets, which estimate is used to correct:

(i) a subsequent execution of the sequence module, and (ii) an MR image reconstructed from said MR image forming sequence.

20. The method of correcting for motion of an object and/or for magnetic field offsets in a region surrounding the object during a magnetic resonance (MR) imaging scan of the object, comprising prospectively and retrospectively correcting for motion of an object and/or for magnetic field offsets in a region surrounding the object during the magnetic resonance (MR) imaging scan of the object, wherein the method of claim 3 is carried out yielding an estimate of the object's motion and/or magnetic field offsets, which estimate is used to correct:

(i) a subsequent execution of the sequence module, and (ii) an MR image reconstructed from said MR image forming sequence.

* * * * *